United States Patent [19]
Vollnhals et al.

[11] 4,069,396
[45] Jan. 17, 1978

[54] POWER SAVING CIRCUIT FOR USE WITH A CONVERTER CIRCUIT IN A TELEPHONE SWITCHING INSTALLATION

[75] Inventors: Friedemann Vollnhals, Wolfratshausen; Klaus Wintzer, Munich, both of Germany

[73] Assignee: Siemens Aktiengesellschaft, Munich, Germany

[21] Appl. No.: 722,401

[22] Filed: Sept. 13, 1976

[30] Foreign Application Priority Data

Sept. 30, 1975   Germany .............................. 2543696

[51] Int. Cl.² ........................................... H04M 11/00
[52] U.S. Cl. ................. 179/2 A; 178/69 G; 179/16 A
[58] Field of Search ............... 179/175.2 C, 175.21, 179/175.23, 175.24, 2 A, 16 A, 77, 81 R; 178/69 R, 69 A, 69 G

[56] References Cited

U.S. PATENT DOCUMENTS

| 3,723,656 | 3/1973 | Curtis et al. | 179/2 A |
|---|---|---|---|
| 4,021,615 | 5/1977 | James et al. | 179/2 A |

FOREIGN PATENT DOCUMENTS

| 2,031,212 | 11/1971 | Germany | 179/2 A |
|---|---|---|---|

*Primary Examiner*—Thomas A. Robinson
*Attorney, Agent, or Firm*—Schuyler, Birch, Swindler, McKie & Beckett

[57] ABSTRACT

Power saving means is shown for use with a converter circuit in a telephone switching installation. The converter circuit comprises an analog-to-digital converter and a digital-to-analog converter. The voltage supply for the converter circuit is switched on only upon the appearance of analog signals to be converted into digital signals or digital signals to be converted into analog signals.

7 Claims, 9 Drawing Figures

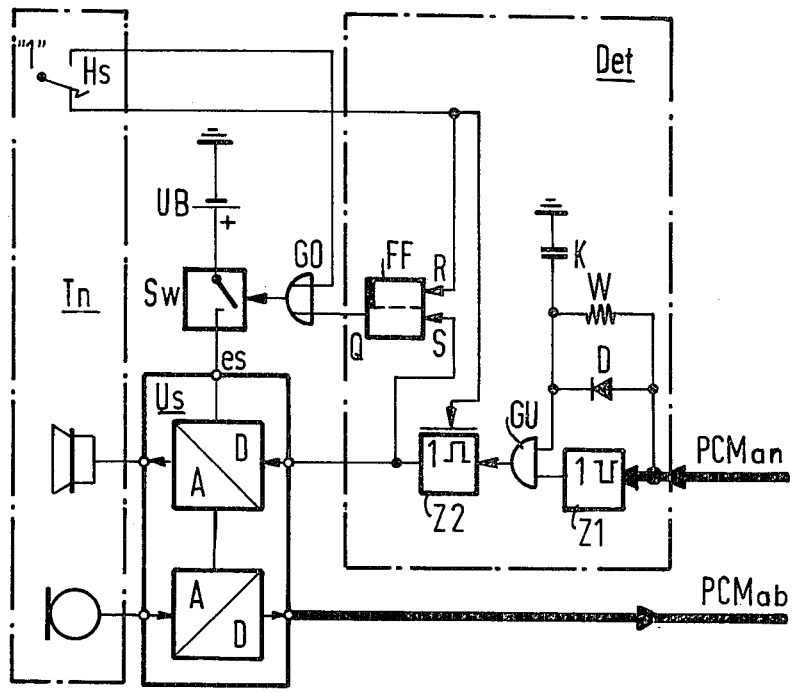

POWER SAVING CIRCUIT FOR USE WITH A CONVERTER CIRCUIT IN A TELEPHONE SWITCHING INSTALLATION

BACKGROUND OF THE INVENTION

The invention relates to a switching arrangement for converting digital signals, more particularly PCM signals, supplied by a signal output device into analog signals to be applied to a telephone station of a telecommunication network and for converting analog signals supplied by the telephone station into digital signals, more particularly PCM signals, to be applied to a signal receiving device through a converter circuit.

Switching arrangements of the type mentioned above are known in the art (French Pat. No. 2,133,522; "IBM-Technical Disclosure Bulletin," Volume 10, No. 9, February 1968, pp. 1372, 1373). A disadvantage of these switching arrangements is the fact that even in their idle condition current is consumed by the converter circuits when no conversion functions need to be performed.

It is therefore an object of the invention to provide means for reducing the current consumption in a switching arrangement of this type in the event that no conversion processes are to be carried out.

In accordance with the invention, the above and other objects are achieved by connecting the converter circuit over a switch to its working supply voltage generator. An enabling signal causes the switch to close in the event a detector circuit, which receives and corrects the digital signals to be converted into analog signals, detects the appearance of at least one of the pulses making up the digital signals. The switch is also enabled in the event the associated telephone station is in its operating condition. The invention ensures that no unnecessary current consumption takes place during the periods when no conversion processes are to be carried out.

SUMMARY OF THE INVENTION

According to a practical embodiment of the invention, the detector circuit comprises a bistable multivibrator which supplies a "1" signal during its set status to the operating input of the switch. The set input is connected to the output of a pulse regenerator associated with the detector circuit. The PCM digital signals are applied at the input end of the pulse regenerator and corrected digital signals are supplied over the output end to the converter circuit. Thus, the detector circuit needs very few switching components.

According to another practical embodiment of the invention, the pulse regenerator comprises two timing elements. The first timing element which is connected to the input of the pulse regenerator, in response to the appearance at its input of the leading edge of one of the pulses making up the PCM digital signals, supplies a pulse at its output whose duration is shorter than that of one of the proper pulses making up the digital signals. The output of this first timing element is connected to the input of an AND element. The other input of the AND element is connected to the input of the first timing element. The output of the AND element is connected to the input of the second timing element which is connected at the output end to one input of the converter circuit. This second timing element supplies a signal to the converter circuit in response to the appearance of the leading edge of a pulse whose duration equals that of a properly appearing pulse of the pulses making up the PCM digital signals. This results in the advantage that the pulse regenerator needs very few switching components.

According to another practical embodiment of the invention, a delay element is inserted in the connection between the input of the first timing element and the other input of the AND element. Preferably, the delay element consists of the parallel connection of a diode, a resistor and a capacitor. This results in the advantage that the pulse time of the first timing element can be compensated relatively easily. Thus, a pulse appearing at the input of the switching arrangement appears at one input of the AND element after the particular pulse time in the delay element and at the other input of the AND element in a period defined by the operating time of the first timing element.

According to another practical embodiment of the invention, the reset input of the bistable multivibrator receives a reset signal from the associated telephone station in the event that the telephone station passes from its operating condition to its idle condition. In this way, the particular switching arrangement can be transferred with very little circuit complexity to its low-current idle condition.

In the last mentioned practical embodiment of the invention, it is of advantage to also utilize the reset signal for resetting the second timing element. Thus, it is easily ensured that upon the transfer of the telephone station to its idle condition no more pulses can be supplied by the second timing element.

According to another practical embodiment of the invention, the timing elements are made up of monostable multivibrators. Thus, the timing elements are constructed of simple technical elements.

According to still another practical embodiment of the invention, the monostable multivibrator forming the first timing element can be reactivated after transfer to its unstable operating state only in the event that it has first returned to its stable idle condition. In this way, noise interference blanking is easily ensured.

BRIEF DESCRIPTION OF THE DRAWINGS

The principles of the invention will be more readily understood by reference to the FIGURE in the drawings which shows the power saving circuit of this invention.

DETAILED DESCRIPTION OF THE INVENTION

The drawing shows schematically a telephone station T$n$ having a transmitting unit and a receiving unit. Also associated with the telephone station T$n$ which may be a telephone set of a PCM time-division multiplex telecommunication network is a selector switch Hs which may be formed by a cradle switch of the telephone set. In the idle condition of the telephone station T$n$, the cradle switch H$s$ is in the position shown. In the operating condition of the telephone station T$n$ the cradle switch Hs takes its other position.

The telephone station T$n$ which continually receives the required working supply voltage, is connected over a converter circuit U$s$ to an outgoing line PCM$ab$ or to an incoming line PCM$an$. The converter circuit U$s$ delivers digital signals, more particularly PCM signals, over the outgoing line PCM$ab$. The converter circuit U$s$ receives digital signals, more particularly PCM signals, over the incoming line PCM$an$.

The converter circuit comprises an analog-to-digital converter, hereinafter called A/D converter, and a digital-to-analog converter, hereinafter called D/A converter. The A/D converter converts analog signals supplied by the transmitting unit of the telephone station T$n$ into digital signals which are delivered to the outgoing line PCM$ab$. The D/A converter receives digital signals appearing on the incoming line PCM$an$ and, where appropriate, converts said digital signals into analog signals which are applied to the receiving unit of the telephone station T$n$. With regard to the converter circuit U$s$ it should be noted that it may, for example, be formed by an A/D converter working along the iterative process and having a D/C converter.

The converter circuit U$s$ is connected with a special supply voltage input "$es$" over a switch S$w$ to a working supply voltage generator UB. Only after the switch S$w$ is connected does the converter circuit U$s$ receive its working supply voltage.

The operating input of the switch S$w$ is connected to the output of an OR element GO. One input of the OR element GO is connected to the normally open contact side of the cradle switch H$s$ of the telephone station T$n$. The other input of the OR element GO is connected to the output of a detector circuit D$et$. As will be apparent hereafter, the detector circuit D$et$ only supplies a "1" signal to the OR element upon the appearance of a proper pulse on the incoming line PCM$an$. A corresponding "1" signal is also applied to the OR element GO when the telephone station T$n$ is in the operating condition, that is to say, when the cradle switch H$s$ has been actuated. It should be noted that the OR element GO could also be replaced by an AND element, so that the switch S$w$ could only be actuated when the telephone station T$n$ is in the operating condition and a proper pulse appears on the incoming line PCM$an$. Where appropriate, a special signal would have to be sent to the telephone station T$n$ indicating that it must be switched to its operating condition.

The detector circuit D$et$, which continually receives its working supply voltage, has a bistable multivibrator FF, which forms with its output Q the output of the detector circuit D$et$. The bistable multivibrator FF is connected with its set input S to the output of a pulse regenerator. The pulse regenerator comprises two timing elements Z1 and Z2 which may each be formed by a monostable multivibrator. A pulse triggered monostable multivibrator is employed for the monostable multivibrator forming the timing element Z1 for the reasons set forth hereinbelow. This pulse triggered monostable multivibrator does not respond to drive pulses that could switch it to its unstable state during the time that it is in its unstable state.

The timing element Z1 is connected with its input directly to the incoming line PCM$an$. The output of the timing element Z1 is connected to an input of an AND element GU. The other input of the AND element GU is likewise connected to the incoming line PCM$an$ over a delay element. The delay element consists of the parallel connection of an ohmic resistance W and a diode D biased in conducting direction for pulses of one polarity (with which, in this case, the pulses to be evaluated do not appear) and a capacitor K. This delay element is connected to the other input of the AND element GU. The output of the AND element GU is connected to the input of the other timing element Z2 which forms with its output the output of the pulse regenerator. This output is connected to the set input S of the bistable multivibrator FF. The output of the timing element Z2 and, thus, of the pulse regenerator, is further connected to the digital-signal-receiving input of the converter circuit U$s$, that is to say, to the input of the converter circuit U$s$ connected to the D/A converter.

The reset input of the timing element Z2 which may be formed by a triggered monostable multivibrator and the reset input R of the bistable multivibrator FF are connected to the normally closed contact side of the cradle switch H$s$ of the telephone station T$n$. This triggered monostable multivibrator responds to the appearance of drive pulses such that, when it is in its unstable state, its operating time starts to run anew in response to each drive pulse. During the operating time the monostable multivibrator is in its unstable state.

Having considered the construction of the switching arrangement shown in the drawing, its operation will now be discussed. Let it first be assumed that the switching arrangement is in its idle condition, during which the switch S$w$ is open. Now, if the telephone station T$n$ is switched to its operating condition, the cradle switch H$s$ is actuated. As a result, the switch S$w$ is closed via the OR element GO and the working supply voltage is applied to the converter circuit U$s$. This means that current consumption in the converter circuit U$s$ occurs only when the circuit arrangement is in the operating condition. Analog signals supplied by the telephone station T$n$ can now be converted into digital signals and delivered to the outgoing line PCM$ab$. Moreover, digital signals arriving over the incoming line PCM$an$ can be converted into analog signals in the D/A converter of the converter circuit U$s$ and applied to the telephone station T$n$.

Let us now consider the case where digital signal pulses appear on the incoming line PCM$an$ at the time the switching arrangement is in the idle condition. If these pulses have a duration that is less than or corresponds to the duration of the pulses supplied by the timing element Z1 which is activated by a pulse leading edge, then the coincidence requirement for the AND element GU cannot be met. Thus, interference blanking is effected by the timing element Z1 in conjunction with the delay element comprising the circuit elements D, W and K and the AND element GU. The delay element compensates the time of the timing element Z1. The timing element Z2 will not initiate an output pulse leading edge until after the expiration of the delay time of the delay element.

If the pulses appearing on the incoming line PCM$an$ have a duration that is longer than that of the pulses supplied by the timing element Z1 which is activated by a pulse leading edge, the coincidence requirement of the AND element GU is met after the appearance of the trailing edge of the pulse supplied by the timing element Z1. Thus a drive pulse is applied to the other timing element Z2 which, in response to the leading edge of the drive pulse, delivers an output pulse of prescribed duration. The timing element Z2 thus provides for the actual pulse regeneration. The first corrected "1" pulse appearing at the output of the timing element Z2 causes the setting of the bistable multivibrator FF which then supplies from its output Q a "1" enabling signal that closes the switch S$w$. Thus, a working supply voltage is applied to the converter circuit U$s$. As a result, current is consumed by the converter circuit U$s$ only if at least one conversion process is to be carried out.

If the telephone station T$n$ is again switched to its idle condition, the cradle switch H$s$ goes to the position shown in the drawing. Thus, the bistable multivibrator FF receives at its reset input R a "1" signal. The appearance of this reset signal prevents the multivibrator FF from supplying a "1" enabling signal. As a result, a switch Sw opens and interrupts the application of supply voltage to the converter circuit Us. Further, the "1" signal supplied from the cradle switch Hs causes the timing element Z2 to be reset to its starting condition. In this way, it is ensured that the timing element Z2 cannot supply yet another "1" signal that will switch the bistable multivibrator FF again to the set status.

We claim:

1. In a telephone switching arrangement having a converter circuit connected to a telephone station of a telecommunications network for converting incoming PCM digital signals into analog signals and for converting outgoing analog signals into PCM digital signals, the improvement comprising:

a voltage source;

power switch means connected between said converter circuit and said voltage source for connecting said voltage source to said converter circuit;

pulse regenerator means triggered by at least one pulse of the incoming PCM digital signals for providing regenerated digital signals to said converter circuit;

bistable multivibrator means connected to said pulse regenerator means for actuating said power switch means in the event said pulse regenerator means provides regenerated digital signals to said converter circuit; and sensing means in said telephone station connected to said power switch means for actuating said power switch means in the event said telephone station is in the operating condition.

2. In the telephone switching arrangement defined in claim 1 said pulse regenerator means comprising:

a first timing element triggered by at least one pulse of the incoming PCM digital signals for providing an output pulse with a pulse duration less than the proper pulse duration of at least one pulse of the incoming PCM digital signals;

an AND gate having a first input connected to the output of said first timing element and a second input connected by a shunt circuit to the incoming PCM digital signals to actuate said AND gate in the event at least one pulse of the incoming PCM digital signals is of the proper pulse duration; and a second timing element triggered by the actuation of said AND gate for providing a pulse with a proper pulse duration to said converter circuit and said bistable vultivibrator.

3. In the telephone switching arrangement defined in claim 2, said shunt circuit including a delay element.

4. In the telephone switching arrangement defined in claim 3, said delay element comprising comprising a parallel-connected diode and resistor in series with a capacitor.

5. In the telephone switching arrangement defined in claim 2, wherein said second timing element receives a reset signal at a reset input, said reset signal being generated by said telephone station in the event said telephone station switches from its operating condition to its idle condition.

6. In the telephone switching arrangement defined in claim 2, wherein said timing elements comprise monostable multivibrators.

7. In the telephone switching arrangement defined in claim 1, wherein said bistable multivibrator receives a reset signal at a reset input, said reset signal being generated by said telephone station in the event said telephone station switches from its operating condition to its idle condition.

* * * * *